United States Patent [19]

Hollis, Jr. et al.

[11] 4,111,775

[45] Sep. 5, 1978

[54] MULTILEVEL METALLIZATION METHOD FOR FABRICATING A METAL OXIDE SEMICONDUCTOR DEVICE

[75] Inventors: Ben R. Hollis, Jr.; William R. Feltner, both of Huntsville, Ala.; David L. Bouldin, Morrison, Tenn.; Donald E. Routh, Huntsville, Ala.

[73] Assignee: The United States of America as represented by the Administrator of the National Aeronautics and Space Administration, Washington, D.C.

[21] Appl. No.: 814,005

[22] Filed: Jul. 8, 1977

[51] Int. Cl.² .......................................... C23C 15/00
[52] U.S. Cl. .............................................. 204/192 C
[58] Field of Search ........ 204/192 C, 192 EC, 192 D, 204/192 E

[56] References Cited

U.S. PATENT DOCUMENTS 3,804,738  4/1974  Lechaton et al. .................. 204/192

OTHER PUBLICATIONS

F. Barson et al., "Hillock Suppression in Aluminum Thin Films", *IBM Tech. Disc. Bull.*, vol. 13, p. 1122 (1970).
P. S. McLeod et al., "High-Rate Sputtering of Aluminum for Metallization of Integrated Circuits", *J. Vac. Sci. Tech.*, vol. 14, pp. 263–265 (1977).
A. Aronson et al., "Inline Production Magnetron Sputtering", *Vacuum*, vol. 27, pp. 151–153 (1977).

*Primary Examiner*—Aaron Weisstuch
*Attorney, Agent, or Firm*—J. H. Beumer; J. R. Manning; L. D. Wofford, Jr.

[57] ABSTRACT

An improved method of constructing a metal oxide semiconductor (MOS) device having multiple layers of metal deposited by D.C. magnetron sputtering at low D.C. voltages and low substrate temperatures provides multilevel interconnections and cross over between individual circuit elements in integrated circuits without significantly reducing the reliability or seriously affecting the yield.

9 Claims, 9 Drawing Figures

MULTILEVEL METALLIZATION METHOD FOR FABRICATING A METAL OXIDE SEMICONDUCTOR DEVICE

ORIGIN OF THE INVENTION

The invention described herein was made by employees of the U.S. Government and may be manufactured and used by or for the Government for governmental purposes without the payment of any royalties thereon or therefor.

BACKGROUND OF THE INVENTION

The increasing demand for complex LSI circuits of both the bipolar and metal oxide semiconductors (MOS) devices have made imperative the development of practical methods for reliable metallization of these devices. Bipolar integrated circuits have been and are now being produced with multiple levels of metal with good results. Many different approaches have been employed to fabricate multilevel metal devices for bipolar LSI and vary from being quite simple to rather complex. Some of these approaches are discussed in an article entitled "Multilayer Metallization for LSI," by C. J. Santoro and D. L. Oliver, Proceedings Of The IEEE, volume 59, No. 10, October, 1971, page 1403. At the present time, most bipolar LSI multilevel devices use aluminum or an aluminum based alloy deposited by electron-beam evaporation, and the insulator is usually silicon dioxide deposited by chemical vapor deposition.

However, there has been very little, if any, fabrication of metal oxide semiconductor (MOS) devices by utilizing multiple layers of metal. This has been primarily due to concern by MOS manufacturers of yield loss and reliability problems in using multilevels of metal on MOS devices. The MOS transistor, a surface effect device, utilizes a thin gate dielectric (silicon dioxide) that is very sensitive to the ionic bombardment produced by conventional deposition techniques. Unlike the bipolar transistor, a bulk effect device, the MOS device cannot tolerate the levels of ion-bombardment produced by conventional RF sputtering, and must be specially treated to anneal out the charges induced in the thin gate dielectric by electron-beam evaporation. Although in the case of electron-beam evaporation much of the induced change can be annealed out thereby limiting the adverse affect on the electrical parameters, the heating cycle (annealing) needed for this step in the process increases hillock growth in the metal layers and this is a major cause of intermetal shorts. Hillock growth can be reduced considerably, and in some cases almost eliminated, by using aluminum alloys. Electron-beam evaporation of aluminum alloys, however, poses numerous problems such as (1) difficulty in obtaining reproducibility, (2) frequent recharging of sources, (3) consistency of deposition, (4) essentially limited to a two material alloy, and (5) roughness on the surface adversely affects the photo masking operation.

At the present time, two methods are generally used to provide multiple levels of interconnect for various elements of an MOS circuit. The first method consists of a diffused conductor, an insulator, and one metal layer. The conductor is diffused at the same time as the source and drain of the MOS device. In this method, with a single layer of metallization, crossovers can only be achieved by a metal conductor crossing over the top of a diffused conductor with the oxide layer acting as an insulator.

Another method used to provide multilevel metallization of an MOS device is polycrystaline silicon, an insulator, and a metal. Polycrystaline silicon may be vapor deposited onto a silicon substrate having a thermally grown silicon dioxide layer with an insulating layer deposited over the polycrystaline silicon. A metal, usually aluminum or an aluminum alloy, is then deposited to provide the second level of interconnects.

The disadvantage of the first method is that the resistance of the diffused conductor is much higher than that of the metal. This relatively high resistance coupled with the capacitance of the insulating oxide layer reduces the response time of the line to electrical signals. The polysilicon used in the second method, while having manufacturing advantages over the diffused conductor, also places a constraint on the circuit speed due to the relative high sheet resistivity thereof.

SUMMARY OF THE INVENTION

The invention relates to a metal oxide semiconductor device having a plurality of metal layers and method of fabricating the same comprising the steps of forming a thermal layer of silicon dioxide on a substrate body and depositing by D.C. magnetron sputtering a first layer of metal on the silicon dioxide layer. An insulation layer of silicon dioxide is deposited over the first layer and a mask is formed on the upper surface of the silicon dioxide layer which is then chemically etched to form a "via" (hole) for providing an interconnection to the first metal layer. A second layer of metal is deposited on the silicon dioxide layer by D.C. magnetron sputtering interconnecting with the first metal layer. Finally a layer of insulating oxide is formed over the second metal layer.

Accordingly, an important object of the present invention is to provide a metal oxide semiconductor device having multiple layers of metal used to provide different patterns of interconnects and crossovers between MOS circuit elements.

Still another important object of the present invention is an improved method for fabricating multilevel metallization on metal oxide semiconductors providing interconnection of individual circuit elements without reducing the reliability or affecting the yield of a large-scale integration.

Another important object of the present invention is an improved method of fabricating a metal oxide semiconductor device wherein multiple layers of metal are deposited by D.C. magnetron sputtering at low power and substrate temperatures reducing the growth of hillocks on the layers and minimizing the problem of interlayer shorts.

Yet another object of the present invention is the conservation of wafer space in large scale integrated circuits by forming multiple layers of metallization on MOS devices in a reliable and improved manner.

BRIEF DESCRIPTION OF THE DRAWINGS

The construction designed to carry out the invention will be hereinafter described, together with other features thereof.

The invention will be more readily understood from a reading of the following specification and by reference to the accompanying drawing forming a part thereof, wherein an example of the invention is shown and wherein.

DESCRIPTION OF A PREFERRED EMBODIMENT

The drawings illustrate a metal oxide semiconductor device (MOS) having a plurality of metal layers to provide various interconnect and crossover patterns in a large scale integrated circuit. Due to the increases in the number of individual devices placed on a single wafer, it has become an expedient to place multiple layers of conductors above each other in order to save space on the wafer. It has been estimated that 40 percent of the wafer area is wasted when interconnecting single layer devices due to the necessity of going around rather than over the device. However, the problems encountered in fabricating a multi-layered device are more acute than in fabricating a single layer device due, primarily, to the problems of interlayer shorts and good ohmic contact between the layers. The present invention discloses a high advantageous method for fabricating an MOS device having a plurality of metal layers by utilizing D.C. magnetron sputtering techniques.

Figure 1:
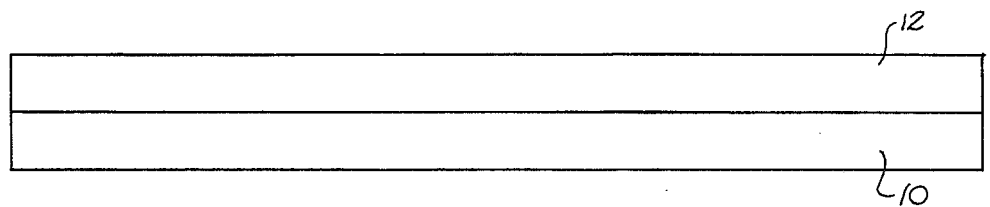
FIG. 1 is a schematic cross-section illustration showing the surface layers prior to metallization and following formation of a thermal silicon dioxide layer on the substrate body.

FIGS. 1 through 7 of the drawings illustrate the layers of a passive MOS device constructed in accordance with the present invention at intermediate steps in the fabrication process. Referring to FIG. 1, a silicon substrate 10 is illustrated on which a thermal silicon dioxide layer 12 is formed in any conventional manner. Preferably, the silicon dioxide layer is formed by thermally oxidizing the silicon substrate by heating the substrate at a temperature of 1,200° C. in a steam atmosphere for approximately 1 hour to form a silicon dioxide layer of approximately 0.5 to 0.6 micrometers. Prior to forming the oxide layer, the silicon may be cleaned by any standard method such as placing the silicon in an alkaline solution to remove any organics, oils, or greases. In one cleaning process, the silicon was placed in a solution of hydrogen peroxide, hydrocloric acid, and water and heated to a temperature of approximately 70° C. for a period of about 10 minutes to remove metallic ion contamination.

Figure 2:
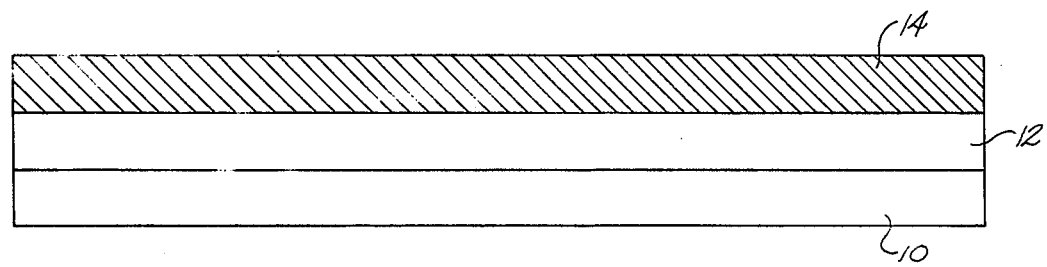
FIG. 2 is a schematic cross-section illustration of the layers after the first metallization layer is deposited by a process in accordance with the present invention.

FIG. 2 illustrates a first metal layer 14 which is preferably pure aluminum or an aluminum alloy. The aluminum is deposited by a sputtering technique generally referred to as D.C. magnetron sputtering. The general characteristics of magnetron sputtering apparatus and techniques are known such as in U.S. Pat. No. 3,956,093 which discloses a planar magnetron sputtering apparatus. In the present invention, a cylindrical magnetron sputtering apparatus was utilized. One suitable apparatus is manufactured by Sloan Technology, Inc., as Model No. S300.

The invention contemplates a metal deposition system arranged with the sputtering target positioned approximately 50 mm from an electrically unbiased wafer holder. A 3 inch magnetron sputtering gun is utilized with the wafers rotated thereabout during sputtering. The sputtering chamber is evacuated and then backfilled with argon gas to attain a sputtering pressure of approximately 5 to 6 microns of mercury. The apparatus is operated in the DC mode at a voltage of from 350 to 450 volts with 400 volts being preferred. The current is delivered at a level of approximately 2 to 3.5 amperes supplying power to the target in the range of 0.7 to 1.5 kilowatts with approximately 1.3 kilowatts of power being preferred.

Sputtering at low power conditions in accordance with the present invention results in very low substrate temperatures wherein deposition takes place at ambient temperatures below 70° C. This has the advantage of reducing hillock growth in the metal layers. This reduction in hillock growth is an expedient and essential to fabricating semiconductor devices having multiple metal layers since hillock growth can penetrate the insulation layer and increases the chances of shorting between adjacent layers of metal. Thus, the likelihood of interlayer shorts is substantially reduced when forming multilayer metallization MOS devices in accordance with the present invention.

In utilizing D.C. magnetron sputtering a plasma is generated in which the argon atoms which are bombarded with electrons in the area of the cathode which is also the target. Once the argon atoms are bombarded with electrons, a positive argon ion is formed which is attracted to the cathode since it is negatively biased. The positive argon ion hits the cathode at very high velocity, dislodging electrically neutral target atoms in all directions, some of which deposit onto the substrates thereabout.

The secondary electrons that are generated in the process are trapped by the passive anode which is at a positive potential with respect to the cathode and are held in the circular magnetic field so that they cannot escape. The secondary electrons are eventually pulled to the anode or recombine with the previously ionized argon atoms. Thus, the secondary electrons do not strike the substrate, reducing to a manageable level the ionic charge introduced into the thin gate dielectric which has been a problem heretofore in fabricating multilayered metallization MOS devices by conventional RF sputtering.

The layers of a multilayer metallization MOS device illustrated in the drawings, were deposited on a 38 mm diameter water. The metal layers were, in one example, deposited at the deposition rate of approximately 1 nanometer per second. At this rate the atoms of aluminum which come off of the cylindrical cathode are sputtered in a multiangle manner that will coat evenly the surface as well as the edges and sides of the vias (holes) and crossovers inherent in the pattern. This is an expedient particularly in forming multilayered metal devices wherein interconnection between the layers is desired. In the illustrated example, a metal layer thickness of approximately 1 micrometer was deposited for each of the metal layers. However, metal thickness up to 2 microns is also contemplated. Pure aluminum was found to be a good metal for sputtering in such a manner while aluminum alloys such as aluminum 2014 have exhibited even better coating characteristics, primarily due to the suppression of hillock growth, when sputtered in accordance with the present invention. Other alloys contemplated by the invention would be aluminum and silicon (Al 98%, Si 2%) and aluminum, silicon, and copper (Al 94%, Si. 2%, Cu 4%).

Figure 3:
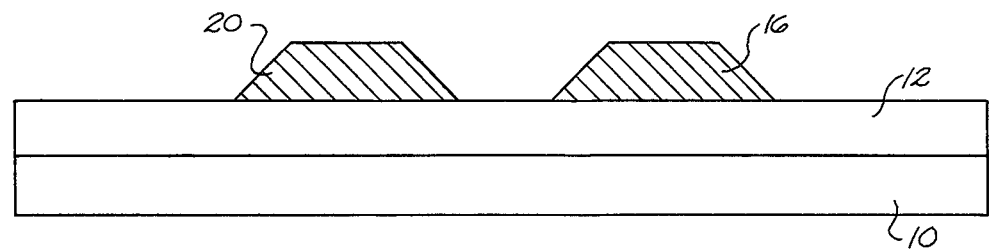
FIG. 3 is a cross-sectional illustration of the metal layer after the layer has been patterned.
Figure 4:
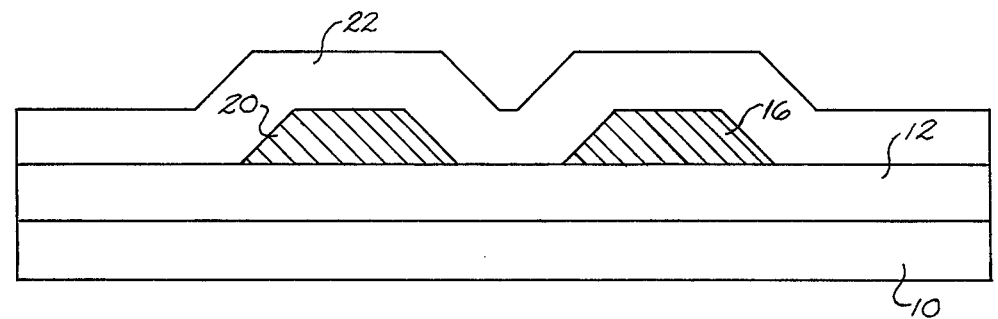
FIG. 4 is a similar illustration of the layers showing a layer of silicon dioxide deposited over the metal layer.
Figure 5:
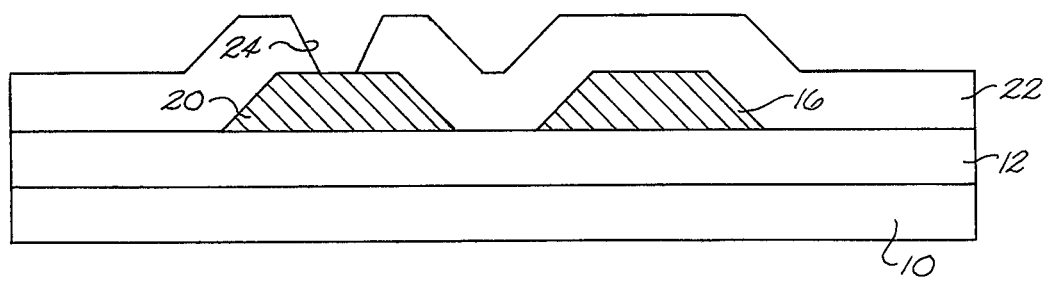
FIG. 5 is a cross-sectional illustration of the layers of the present invention showing masking and etching of the silicon dioxide layer to provide a via (hole) for interconnecting the first metal layer.
Figure 6:
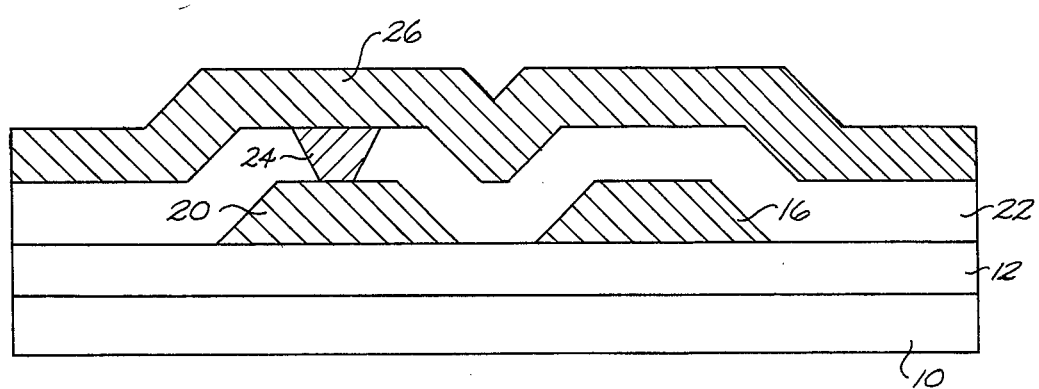
FIG. 6 is a similar illustration showing the layers of the present invention after deposition of the second layer of metallization which interconnects with the first metal layer.
Figure 7:
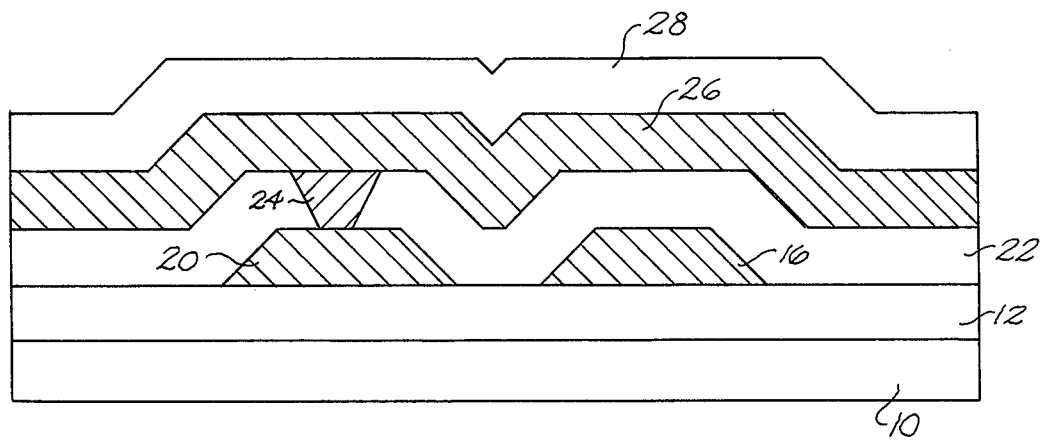
FIG. 7 is a similar illustration of the layers of the present invention after depositing the final layer of dielectric material over the second metal layer covering the entire semiconductor device.

Following the depositing of a metal layer by D.C. magnetron sputtering, the first level of aluminum 14 (FIG. 2) is masked and etched according to a standard photolithographic process so that the aluminum may be patterned into the first level of interconnects. Referring more particularly to FIG. 3, it can be seen that the aluminum has been patterned such that a middle section of the aluminum is removed, leaving a pair of aluminum conductors 16 and 20. The excess aluminum is preferably chemically removed by a solution of phosphoric, acetic, and nitric acids (25:5:1) at 50°-80° C. The remaining photoresist is then removed using standard chemical procedures.

Next, an insulation layer of silicon dioxide or other suitable dielectric material is deposited over the aluminum by any standard chemical vapor deposition technique. In the illustrated embodiment, a layer of 0.6 micrometers was deposited by a standard chemical vapor deposition technique at a temperature of 400° C. A layer thickness of 0.6 to 0.8 micrometers is necessary to prevent shorting between the adjacent metal layers and to insure that any imperfections in the insulation layer do not extend through the entire layer thickness. Following deposition of the dielectric material, the insulating silicon dioxide layer 22 (FIG. 5) is patterned and etched to provide a via 24 to allow a second level of metallization to contact the first level of metallization where desired. According to the multilevel metallization process of the present invention, various patterns of interconnect and crossovers may be had.

After the layer of silicon dioxide has been patterned to provide the desired via a second layer of aluminum 26 (FIG. 6) is deposited by D.C. magnetron sputtering in the same manner as the metal layer 14 previously. The second level of aluminum 26 will be completely insulated from interconnection with the aluminum conductor 16 except where it will go down into the via 24 and contact conductor 20 so that an interconnect is provided between the first layer at conductor 20 and the second layer 26. If layer 26 of aluminum is the last metal layer to be deposited, a final insulation layer of passivation oxide 28 (FIG. 7) is deposited over the aluminum layer 16 to completely cover the device and protect the device from mechanical and atmospheric contamination and damage. For this purpose, the insulation layer 28 is deposited in the same manner as the silicon dioxide layer 22 but is approximately 0.8 to 1.0 micrometer in thickness. Any suitable insulation material such as silicon dioxide may be used. Of course other metallization layers may be formed to provide additional interconnects or crossovers without the need for additional lateral space on the wafer.

Figure 8:
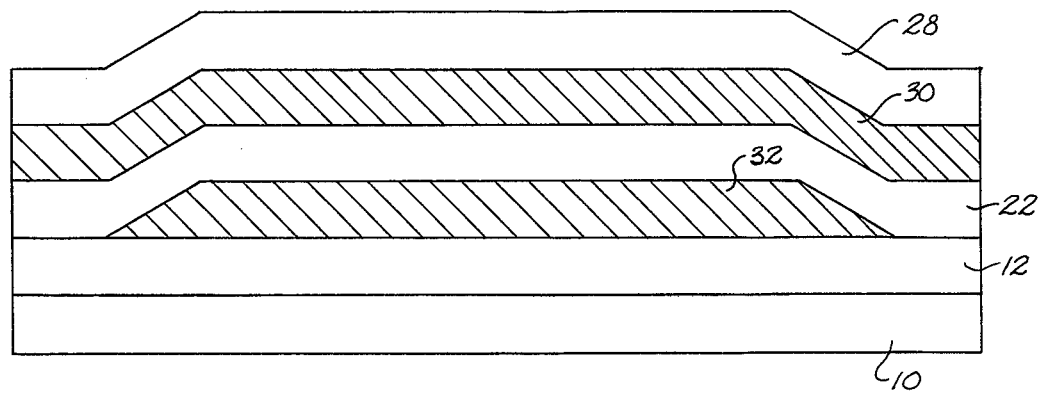
FIG. 8 illustrates the layers of a device fabricated in accordance with the present invention wherein the second metal layer crosses over but does not interconnect with the first metal layer.

FIG. 8 illustrates a second level metal interconnect 30 which crosses over a first level metal interconnect 32 but which does not contact nor interconnect therewith. The metal layer 32 is perpendicular to the layer 30 and separated therefrom by an insulator of deposited silicon dioxide 22. The metal conductors 32 and 30 are perpendicular to each other with conductor 32 going into the paper and conductor 30 oriented horizontally across the drawing.

Figure 9:
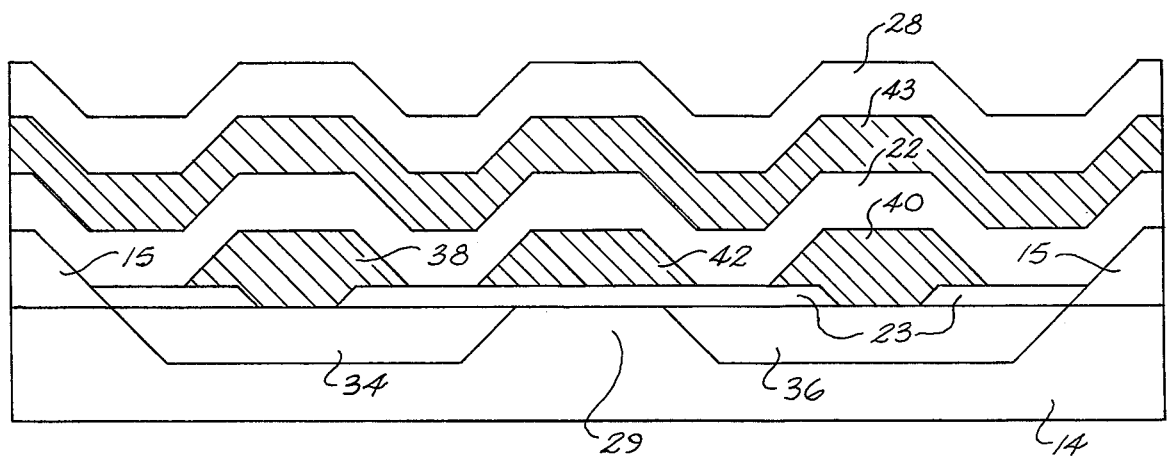
FIG. 9 is a schematic cross-section illustration of an active device over which a second metal layer crosses to route a signal thereover.

The previous examples and discussion have been related to utilizing the multilevel metallization process for forming passive devices to provide for signal interconnects and crossovers in an integrated circuit. FIG. 9 illustrates a complete active device with source and drain difusions labeled 34 and 36, respectively, in the form of an MOS field effect transistor with a second level crossover. A first level of metal is patterned having conductors 38 and 40 contacting the source and drain diffusions, respectively. A metal conductor 42 is also patterned from the first level of metallization to form a gate. A second layer of metal 43 is routed over the layers constituting the active device. The remaining layers of silicon dioxide 22 and the outer layer of insulation or passivation oxide 28 are formed in the manner heretofore described.

It has been found that by utilizing D.C. magnetron sputtering techniques in accordance with the present invention multilevel metallization MOS devices may be formed having a reduced number and size of hillocks which reduces the problem of interlayer shorts between adjacent layers of metal therein. The damage to the thin gate dielectric which is normally encountered in producing repeated layers of metal in MOS devices by the prior methods is avoided to a large extent by the present process increasing circuit reliability and yield. Furthermore D.C. magnetron sputtering provides an excellent technique for directly depositing metal alloys, which also substantially reduced hillock growth, whereas in conventional evaporation methods the alloys are not easily deposited because of the fact they go through a fractional distillation process and would separate under standard evaporation conditions. One particular alloy of aluminum, generally referred to as aluminum 2014, has been found to be particularly suitable for D.C. magnetron sputtering. The aluminum coats very evenly not only over the surface of the adjacent layer but also over the edges or the angles of the steps on the vias (holes) and crossovers that are being patterned. This even coating enhances the circuit continuity and reduces open circuits. This is of particular importance when fabricating multiple layers of metal requiring interconnections through vias where open circuiting can easily be a problem.

While a preferred embodiment of the invention has been described using specific terms, such description is for illustrative purposes only, and it is to be understood that changes and variations may be made without departing from the spirit or scope of the following claims.

What is claimed is:

1. A method of fabricating a metal oxide semiconductor device having a plurality of metal layers comprising the steps of:
    (a) providing a silicon substrate body and forming a thermal layer of silicon dioxide on said substrate;
    (b) depositing a conductive layer of metal on the said thermal silicon dioxide layer by D.C. magnetron sputtering at a low power setting of less than 1.5 kilowatts to produce a substrate temperature of below 70° C. during deposition;

(c) depositing an insulation layer of dielectric material over said metal layer;

(d) depositing a layer of metal on said layer of dielectric material by repeating step (b);

(e) repeating steps (c) and (d) until a desired number of metal layers is formed; and (f) forming a layer of insulating oxide over the last of said metal layers.

2. The method of claim 1 comprising the step of masking and etching said layer of dielectric material of step (c) above to form a via providing an interconnection between the first and second of said metal layers.

3. The method of claim 1 wherein said thermal silicon dioxide layer is approximately 0.6 micrometer in thickness.

4. The method of claim 1 wherein said metal layers are deposited by magnetron sputtering at a voltage of 350 to 450 volts and at a current level of 2 to 3.5 amperes.

5. The method of claim 1 wherein said metal layers are deposited by D.C. magnetron sputtering at approximately 1 kilowatt of power producing low substrate temperatures reducing hillock growth on the metal layers.

6. The method of claim 1 wherein said metal layers are sputtered to approximately 1.0 micrometer in thickness.

7. The method of claim 1 wherein said metal layers are sputtered at a rate of 1 nanometer per second.

8. The method of claim 1 wherein each said layer of dielectric material is 0.6 to 0.8 micrometer in thickness.

9. A method of fabricating a metal oxide semiconductor device of the type having a plurality of metal layers wherein a thermal layer of silicon dioxide is formed on a silicon substrate body followed by the decomposition of alternate layers of conductive metal and dielectric material until a desired number of metal layers are formed comprising the steps of:

depositing said metal layers by D.C. magnetron sputtering at a rate of approximately 1 nanometer per second;

sputtering said metal at a power setting of 0.7 to 1.3 kilowatts, and maintaining the temperature of said substrate at an ambient temperature of below 70° C.

* * * * *